(12) United States Patent
Ma et al.

(10) Patent No.: US 6,583,062 B1
(45) Date of Patent: Jun. 24, 2003

(54) METHOD OF IMPROVING AN ASPECT RATIO WHILE AVOIDING ETCH STOP

(75) Inventors: Ching-Tien Ma, Tainan (TW); Tsung-Chuan Chen, Tainan (TW); Shew-Tsu Hsu, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/072,764

(22) Filed: Feb. 7, 2002

(51) Int. Cl.[7] ............................................. H01L 21/311
(52) U.S. Cl. ..................... 438/700; 438/706; 438/725; 438/795
(58) Field of Search ................... 438/690, 694, 438/700, 706, 714, 725, 738, 795

(56) References Cited

U.S. PATENT DOCUMENTS 6,218,310 B1 * 4/2001 Shen et al. ................. 438/714

* cited by examiner

*Primary Examiner*—Olik Chaudhuri
*Assistant Examiner*—Hsien Ming Lee
(74) *Attorney, Agent, or Firm*—Tung & Associates

(57) ABSTRACT

A plasma etching method for improving an aspect ratio including an etching profile including providing a substrate including an oxide containing insulating layer in a multi-layer semiconductor device having at least a first underlying etching stop layer and at least a second etching stop layer overlying the oxide containing insulating layer; providing a patterned photoresist layer exposing an uppermost layer of the substrate for plasma etching; plasma etching through a thickness of at least a portion of the substrate; exposing the substrate to a polymerizing radiation source in at least a first curing process to initiate polymer cross-linking reactions; and plasma etching through at least another portion of a thickness of the substrate.

20 Claims, 1 Drawing Sheet

METHOD OF IMPROVING AN ASPECT RATIO WHILE AVOIDING ETCH STOP

FIELD OF THE INVENTION

This invention generally relates to plasma etching of semiconductor features and more particularly to a method for etching high aspect ratio features to achieve a higher aspect ration with more uniform etching profile while avoiding the phenomenon of etch stop.

BACKGROUND OF THE INVENTION

During the formation of semiconductor devices it is often required that the conductive layers be interconnected through holes in an insulating layer also referred to as an inter-layer dielectric (ILD) layer. Such holes are commonly referred to as contact holes, i.e., when the hole extends through an insulating layer to an active device area, or vias, i.e., when the hole extends through an insulating layer between two conductive layers. The profile of a hole is of particular importance since that it exhibits specific electrical characteristics when the contact hole or via is filled with a conductive material. Typically, the holes are high aspect ratio holes, meaning that the ratio of length to width is at least greater than about 2 and may extend up to bout 4. Such holes are typically formed by a plasma etch process where complex chemical processes result in relatively higher etching rates in one direction versus another, known as anisotropic etching. The relative anisotropicity or selectivity of the etching process will in turn determine the etching profile of an etched hole and consequently its aspect ratio. As semiconductor structures are inevitably driven to smaller sizes, successful etching of higher aspect ratio holes is becoming more difficult.

In anisotropically etching contact or via holes (openings), plasmas containing fluorocarbons or hydrofluorocarbons including oxygen and nitrogen are typically optimized in various steps in a plasma etch process to selectively etch through the various layers of materials included in a multi-layer semiconductor device. For example, it is typically required to selectively etch through a metal nitride or silicon carbide layer forming the etching stop layer prior to etching the contact or via hole through the ILD layer while minimizing the etching of an overlying patterned photoresist layer. For example, plasmas containing fluorocarbons or hydrofluorocarbons such as $CF_4$ and $CHF_3$ are used to etch through the etching stop layer and more carbon rich hydrofluorocarbons such as $C_4F_6$ are used to etch through the etching stop layer and the ILD layer. Using carbon-rich hydrofluorocarbon containing plasmas provides a means of selectively etching high aspect ratio contact and via holes through oxide layers such as an inter-layer dielectric (ILD) layer while minimizing etching of the overlying hardmask or etching stop layer.

The key mechanisms responsible for achieving high aspect ratio anisotropic etching with a high etching selectivity involves the combination several factors including the deposition of nonvolatile residue, e.g., a polymeric carbon containing residue on various etching surfaces during the etching process acting to slow the relative etching rate on those surfaces In addition, oxygen originating from the etching of an oxide by direct impact of plasma ions (i.e., hole bottoms) acts to reduce polymeric residue deposition by the formation of volatile species thereby increasing an etching rate on that surface. While carbon containing residues are found to deposit on all surfaces inside an etch chamber containing fluorocarbon or hydrofluorocarbon plasmas, less accumulation is observed to occur on oxide surfaces, e.g., ILD surfaces, than on non-oxide surfaces, e.g., silicon containing surfaces such as silicon nitride, silicon carbide, and silicon oxynitride, typically used as etching stop layers overlying and ILD layer. Consequently, preferential anisotropic etching selectivities using carbon-rich hydrofluorocarbons have achieved some success in the prior art in the selectively etching of oxide containing ILD layers having an overlying etching stop layer.

If the formation of polymeric residual species proceeds a too high a rate, an "etch stop" phenomenon with respect to high aspect ratio features, such as contact holes and vias, is problematic. For example, during the etching of a contact hole or via, a nonvolatile polymeric residual layer may be formed on the sidewalls and bottom surface of the contact hole or via from carbon containing neutral species resulting from the etch process. The carbon for forming the polymeric residue originates from hydrofluorocarbons used in the etching process, for example, carbon-rich hydrofluorocarbons frequently used to etch oxide ILD layers to gain anisotropicity and selectivity of etching the oxide versus, for example, an overlying etching stop layer. Deposition of the polymeric residue and etching of the oxide layer occur simultaneously. When high aspect ratio features are etched, the etch rate and etch chemistry vary with the aspect ratio and etching depth of the feature. Often the etching process begins normally until the etched hole reaches a particular depth or aspect ratio at which point the etching process undesirably stops due to excess deposition of polymeric residue within the etched feature, i.e., "etch stop" phenomenon.

Therefore, a major problem in etching high aspect ratio contact holes and vias in oxides is that the etching chemistry includes a high rate of polymeric residue formation in high aspect ratio holes frequently resulting in premature etch stop. These effects are most severe in contact hole and via etch processes because of the need to use a chemistry in which the etching of the oxide and the deposition of a polymeric residual material are taking place simultaneously. Because of the polymer deposition, the etch process may stop spontaneously well before the desired oxide is etched to a desired depth, i.e., etch stop.

As vias and contact hole sizes get increasingly smaller in diameter with about the same etching hole depth requirement, the aspect ratio increases and therefore the required anisotropicity of the etching process increases. However, a major problem in smaller contact holes is the increased probability of etch stop as the rate of formation of polymeric residues at hole bottoms becomes higher than the rate of removal. As such, the etching rate is slower and the probability of etch stop is increased. Attempts to overcome this problem have including efforts to use a cleaner etching chemistries resulting in less deposition of polymeric residue, such as using higher oxygen concentrations, have proven unsuccessful in that such chemistry leads to undesirably high etching stop layer and photoresist etching rates forming a tapered opening at the etch surface. As a result, the plasma etching chemistries of the prior art are on the one hand limited by the necessity of using carbon-rich plasmas to achieve anisotropicity and selectivity while simultaneously increasing the probability of etch stop as etching hole aspect ratios increase. On the other hand, approaches including increasing oxygen concentration to limit the polymeric residue buildup reduces etching selectivities with respect to overlying layer including etching stop and photoresist layers.

In FIG. 1A, for example, is shown a portion of a multilayer semiconductor device having a conductive area 12A formed in a first insulating layer 12B with an overlying first etching stop layer 16A, for example a metal nitride or metal carbide. Overlying the first etching stop layer 16A is an insulating layer (ILD layer) 18 followed by a second overlying etching stop layer 16B. Overlying the etching stop layer 16B in many cases is an optional metal nitride dielectric anti-reflectance coating (DARC) (not shown) for reducing light reflection in a subsequent photolithographic patterning process of the overlying photoresist layer 14B to define, for example the via etching hole 14A locations.

In a typical plasma etching process, the etching chemistry is typically optimized for the particular etching step, for example first etching through the metal nitride layer, for including, for example a DARC layer (not shown) and etching stop layer 16B. After etching through the DARC and etching stop layers, according to the prior art, a carbon rich hydrofluorocarbon chemistry is used to passivate the sidewalls of the etched hole during etching through the ILD layer. However, the carbon rich chemistries used in the prior art, including oxygen, frequently result in the formation of excessive polymeric residue during ILD etching thereby slowing the etching rate and increasing the probability for etch stop phenomena while providing limited protection of the etching stop layer as etching times increase.

For example, referring to FIG. 1B is shown a typical contact hole or via etching opening 20A with a profile following a typical prior art etching process where the profile shows preferential etching of the photoresist layers 14B and the second etching stop layer 16B, forming a tapered opening 20B at the etch surface, thereby decreasing an aspect ratio and increasing a hole diameter at the etch surface. As a result, design rules and electrical performance for the semiconductor device are compromised leading to adverse device performance.

These and other shortcomings demonstrate a need in the semiconductor processing art to develop a method for improving a plasma etching process to achieve more uniform etching profiles including a higher aspect ratio without occurrence of the phenomenon of etch stop.

It is therefore an object of the invention to provide a method for improving a plasma etching process to achieve more uniform etching profiles including a higher aspect ratio without occurrence of the phenomenon of etch stop while overcoming other shortcomings and deficiencies in the prior art.

SUMMARY OF THE INVENTION

To achieve the foregoing and other objects, and in accordance with the purposes of the present invention, as embodied and broadly described herein, the present invention provides a plasma etching method for improving an aspect ratio including an etching profile.

In a first embodiment, the method includes providing a substrate including an oxide containing insulating layer in a multilayer semiconductor device having at least a first underlying etching stop layer and at least a second etching stop layer overlying the oxide containing insulating layer; providing a patterned photoresist layer exposing an uppermost layer of the substrate for plasma etching; plasma etching through a thickness of at least a portion of the substrate; exposing the substrate to a polymerizing radiation source in at least a first curing process to initiate polymer cross-linking reactions; and, plasma etching through at least another portion of a thickness of the substrate.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

While the method of the present invention is explained in with reference to plasma etching of a via or contact holes (opening) it will be appreciated that the present invention may be applied to the etching of any high aspect ratio semiconductor feature where maintaining an anisotropic profile while increasing an aspect ratio may be beneficial in the art of semiconductor device manufacturing including for example, a shallow trench isolation (STI) feature. For example, as explained further below, etching of via or contact holes may include etching via holes as one step in forming a dual damascene structure.

Figure 1A:
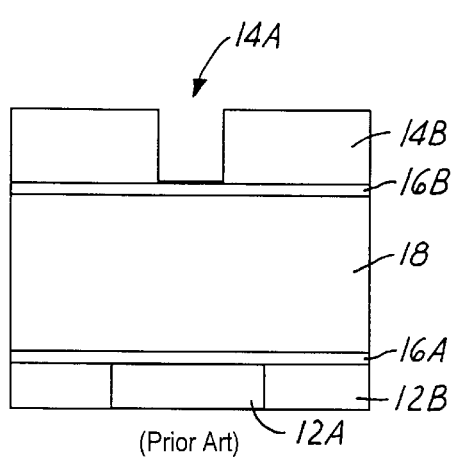
FIGS. 1A–1B are representative cross section side views of a portion of a multilayer semiconductor device at stages of manufacturing according to the prior art.
Figure 1B:
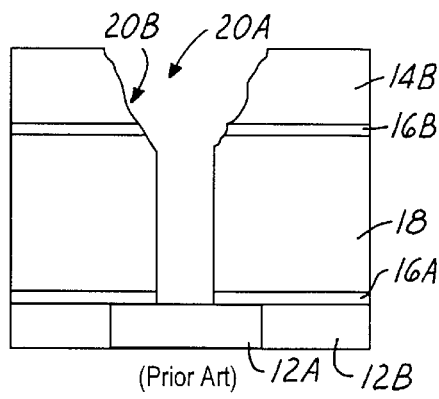
Figure 2A:
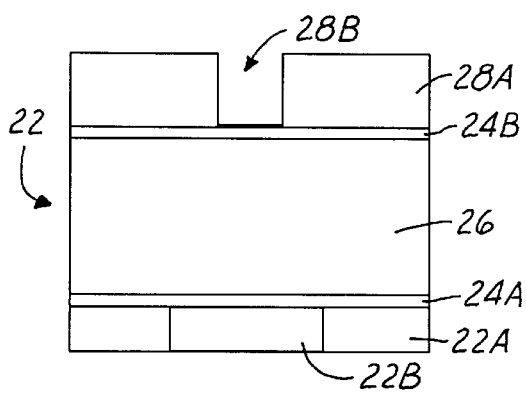
FIGS. 2A–2D are representative cross section side views of a portion of a multilayer semiconductor device at stages of manufacturing according to the present invention.

For example, referring to FIG. 2A, is shown a portion of a multilayer semiconductor device included in a semiconductor wafer showing a substrate 22 for creating for example, a via in a dual damascene structure at a stage in the manufacturing process. The substrate 22 includes a first insulating layer 22A with, for example, a conductive area 22B formed therein. Overlying the first insulating layer 22A and conductive are 22B, is formed a first etching stop layer 24A including a metal nitride or metal carbide material, for example, silicon nitride (e.g., $Si_3N_4$), silicon carbide (e.g., SiC), or silicon oxynitride (e.g., SiON). The etching stop layer 24A is typically deposited by a (chemical vapor deposition (CVD) process including for example, PECVD (plasma enhanced CVD), LPCVD (low pressure CVD), or HDPCVD (high density plasma CVD) under conditions that are well known in the art. A typical thickness of the etching stop layer 24A, for example, is between about 300 and 1000 Angstroms.

Overlying the first etching stop layer 24A is an insulating, inter-layer dielectric (ILD) layer 26 (insulating layer) for subsequently etching a semiconductor feature, for example, a contact hole or via, formed of, for example, low-k doped silicon dioxide. The ILD layer 26 is typically formed by a PECVD process although other processes well known in the art may be used. The ILD layer 26 is typically formed to a thickness of between about 4000 and 10000 Angstroms. As device sizes shrink, typically a low-k (low dielectric constant) material, for example doped silicon oxide, with a dielectric constant of less than about 3.0 is used for the ILD layer 26 in order to reduce signal delay times due to parasitic capacitance effects.

Overlying the ILD layer 26 is a second etching stop layer 24B, formed of, for example, silicon nitride, silicon carbide, or silicon oxynitride. Optionally formed over the second etching stop layer 24B, is a dielectric anti-reflective coating (DARC) layer (not shown) to reduce light reflectance in a subsequent photolithographic patterning step of subsequently deposited photoresist layer 28A. The optional DARC layer is typically a silicon oxynitride layer which can be optically optimized by varying oxygen content.

Still Referring to FIG. 2A, the photoresist 28A layer with a thickness of about 3000 to about 10000 Angstroms is photolithographically patterned by conventional means to define an etching hole 28B, for example a via pattern overlying the etching stop layer 24B (or DARC layer (not shown)) for etching a via opening. The photoresist layer 28A may include a conventional photoresist layer exposed at conventional UV wavelengths (e.g. 250–400 nm) or may be a single or bi-layer resist used for example, in deep ultraviolet (DUV) patterning using wavelengths of less than about 250 nm.

Figure 2B:
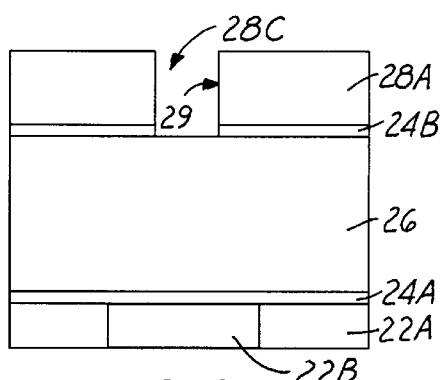

In one embodiment of the present invention, referring to FIG. 2B in a first plasma etching or reactive ion etching (RIE) step the second etching stop layer 24B is at least partially etched through a thickness, preferably to expose the ILD layer 26 by a conventional etching chemistry to form a hard mask opening 28C as shown in FIG. 2B. For example, the etching chemistry may include $CHF_3$, oxygen and nitrogen.

Following at least partially etching through the second etching stop layer 24B, in one embodiment of the method according to the present invention the semiconductor wafer including the photoresist layer 28A and hardmask opening 28C is subjected to a polymerizing radiation source in a curing process prior to etching the via or contact hole in the ILD layer 26. It has been found that subjecting the hardmask opening 28C to a polymerizing radiation curing process, for example ultraviolet (UV) light, prior to etching a via hole in the ILD layer 26 provides a more uniform etching profile. The exposure of the hardmask opening 28C to UV light initiates cross linking polymerizing reactions in the polymeric residue remaining from the etching process on the sidewalls e.g., 29 of the hardmask opening 28C, including the sidewalls of the etching stop layer 24B and the photoresist layer 28A. It is believed that cross linking polymerizing reactions induced by the polymerizing radiation in the polymeric residue acts to increase an etching resistance in a subsequent etching process and further, reduces subsequent polymeric residue deposition at the bottom portion of the etched hole thereby providing more uniform etching profiles and higher aspect ratios. For example, by increasing the etching resistance of the hardmask opening 28C, a subsequent ILD etching process avoids the phenomenon of etch stop by using conventional etch chemistries in etching high aspect ratio openings.

Preferably, the polymerizing radiation curing process is carried out for a period of time to allow for substantial cross-linking of the polymeric residue present in the etched semiconductor feature to occur. It will be appreciated that sources of polymerizing radiation, and exposure procedures, curing times, wavelengths and intensities for the polymerizing radiation curing process may vary widely depending on the desired degree of polymerization, and other factors known to those of ordinary skill in the art. Photopolymerization processes and their operational parameters are well known in the art. For example, sources of polymerizing radiation and the wavelength of the polymerizing radiation may vary widely; however, it is preferable for convenience of polymerizing radiation sources available that the wavelength is in the ultraviolet light range from about 250 nm to about 400 nm. Alternatively, the processing can utilize a multiphoton process initiated by a high intensity source of polymerizing radiation such as a laser. For example, an argon ion laser operating in the UV mode at several wavelengths near 350 nm is desirable. Also, a frequency-doubled argon ion laser with output near 257 nm wavelength is highly desirable. Thus, exposure to ultraviolet light (250–400 nm wavelength) is convenient. In addition, exposure to deep ultraviolet light (190–300 nm wavelength) is useful. Convenient sources are high pressure xenon or mercury-xenon arc lamps fitted with appropriate optical filters to select the desired wavelengths for processing. Also, short wavelength coherent radiation is useful for the practice of this invention. For example, x-ray, electron beam or ion beam excitation may also be utilized. Typical exposure times normally vary from a few tenths of seconds to about several minutes depending on the polymerizing radiation source. Temperatures usually range from about 10° C. to about 60° C.; however, room temperature is preferred. In an exemplary polymerizing radiation curing process a total exposure at the semiconductor wafer surface at a wavelength of about 350 nm may vary from about 10 to about 160 $mw/cm^2$.

Figure 2C:
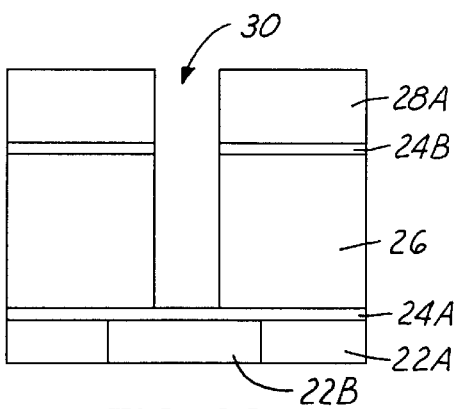

Following the polymerizing radiation curing process of the hard mask opening, a conventional carbon-rich hydrofluorocarbon etching chemistry is used to etch at least partially through a thickness of the ILD layer 26, preferably to expose the first etching stop layer 24A to form, for example, a via opening 30 as shown in FIG. 2C.

Figure 2D:
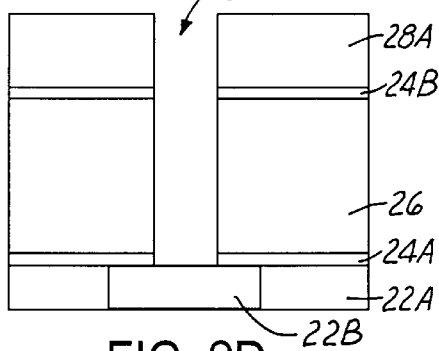

In another embodiment according to the present invention, the semiconductor wafer including the etched feature, for example, via opening 30 is subjected to at least a second polymerizing radiation curing process prior to etching through a thickness of the first etching stop layer 24A to contact the conductive area 22B to complete the via opening formation process as shown in FIG. 2D.

It will be appreciated that one polymerizing radiation curing process, for example, curing the hard mask opening 28C may be sufficient to control an etching profile while avoiding the etch stop phenomenon of excessive buildup of polymeric residues. For example, the etching chemistries may vary including striking a balance between the amount of oxygen used to minimize polymeric residue buildup while undesirably increasing an etching rate of photoresist layer and etching stop layer. It will also be appreciated that more than two polymerizing radiation curing steps may be advantageously used during etching of the ILD layer.

For example, in another embodiment, at least a second intermediate polymerizing radiation curing process is carried out after partially etching through a portion of the ILD layer 26 to partially form via opening 30 during the etching process of the ILD layer. For example, this embodiment may be advantageously used to minimize etching of the etching stop layer 24B when a relatively higher amount of oxygen is used in the etching chemistry to reduce polymeric residue buildup on the via sidewalls.

In another embodiment, an additional polymerizing radiation curing process is optionally performed after completion of ILD etching to form the etched feature, for example a via opening 30, but prior to etching through the first etching stop layer 24A to expose the conductive area 22B.

Figure 3:
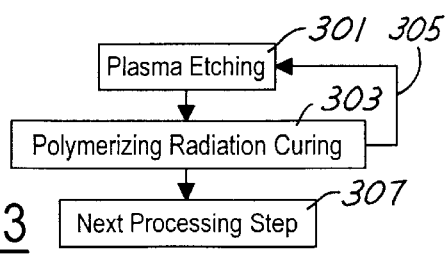
FIG. 3 is a general process diagram encompassing several embodiments of the present invention.

In another embodiment according to the present invention, a first polymerizing curing process is first performed after partially or completely etching through the ILD layer 26. Referring to FIG. 3, for example, is a general process flow diagram encompassing several embodiments of the present invention. For example, a first etching process 301 is carried out to partially etch through a substrate including at least two materials with differing etching selectivities. Following a first etching process, the substrate including the partially etched feature is exposed to a polymerizing radiation source to carry out a polymerizing curing process in step 303. The etching may then be repeated by carrying our subsequent etching and curing processes as indicated by process arrow 305 as necessary to optimize an etching profile prior to proceeding to a next semiconductor wafer processing step 307, for example, photoresist stripping and wafer cleaning.

In an exemplary process for etching an ILD layer, for example, a doped silicon dioxide, it has been found that suitable pressures for the etching process are from about 40 to about 60 milliTorr. Suitable levels of microwave power supplied to the plasma are from 1000 to about 1800 Watts. Hydrofluorocarbons such as $C_4F_8$, $C_5F_8$, or $C_4F_6$, (indicating the number the carbon and fluorine molecules) or a mixture thereof is preferably supplied with a flow rate from about 5 to about 15 sccm. Further, a nitrogen flow rate is preferably supplied from about 150 to about 300 sccm with an oxygen flow rate from about 2 to about 10 sccm.

The various advantages included in the present invention overcome shortcomings in the prior art including providing an etching method whereby an aspect ratio is improved including a more uniform etching profile. Aspect ratios have been found to be increased by about 11 percent in an exemplary etching process following a polymerizing radiation curing process according to one embodiment of the present invention. According to the embodiments of the present invention, etching chemistries may be used that otherwise would result in a tapered etching profile according to the prior art. In addition etching chemistries may be used that would otherwise result in the premature etch stop phenomenon according to the prior art. Thus, the present invention provides a method for improving a plasma etching process to achieve more uniform etching profiles and consequently a higher aspect ratio without occurrence of the phenomenon of etch stop.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A plasma etching method for improving an aspect ratio including an etching profile in a multilayer semiconductor device comprising the steps of:
   providing a substrate comprising a first material layer overlying a second material layer;
   providing a patterned photoresist layer exposing the first material layer for plasma etching;
   plasma etching through a thickness portion of the substrate to form an opening;
   exposing the opening to a polymerizing radiation source in at least a first curing process to initiate polymer cross-linking reactions in polymeric etching residues present within the opening; and
   plasma etching through at least another thickness portion of the substrate.

2. The method of claim 1, wherein the thickness portion comprises the first material layer to form a hardmask opening.

3. The method of claim 2, wherein the thickness portion comprises at least a portion of the second material layer.

4. The method of claim 1, wherein the at least another thickness portion comprises at least a portion of the second material layer.

5. The method of claim 4, wherein the at least another thickness portion comprises a third material layer underlying the second material layer.

6. The method of claim 1, further comprising exposing the opening to the polymerizing radiation source in at least a second curing process following the step of plasma etching through the at least another thickness portion.

7. The method of claim 6, wherein the steps of exposing the opening to the polymerizing radiation source and plasma etching through the at least another thickness portion are sequentially repeated.

8. The method of claim 1, wherein the first and second material layers are selected from the group consisting of a metal nitride, metal carbide, and metal oxide.

9. The method of claim 1, wherein the first material layer is selected from the group consisting of silicon nitride, silicon oxynitride, and silicon carbide.

10. The method of claim 1, wherein the polymerizing radiation source is selected from the group consisting of ultraviolet light, x-rays, ions, and electrons.

11. The method of claim 10, wherein the ultraviolet light comprises wavelengths from about 193 nanometers to about 400 nanometers.

12. The method of claim 1, wherein the patterned photoresist layer is patterned according to a DUV light source.

13. A plasma etching method for increasing an aspect ratio and avoiding etch stop phenomenon in a semiconductor feature etching process comprising the steps of:
   providing a substrate including at least a first material overlying a second material, the first and second materials having differing etching selectivities in a plasma etching process;
   providing a patterned photoresist layer exposing an uppermost layer of the substrate;
   plasma etching through a first thickness portion of the substrate to form a feature opening;
   exposing the substrate to an ultraviolet radiation source in at least a first curing process to accomplish polymer cross-linking reactions within the feature opening; and,
   plasma etching through at least another thickness portion of the substrate.

14. The method of claim 13, wherein the first thickness portion includes at least a portion of the first material.

15. The method of claim 13, wherein the at least another thickness portion includes at least a portion of the second material.

16. The method of claim 13, further comprising exposing the substrate to the ultraviolet radiation source in at least a second curing process following the step of plasma etching through the first thickness portion.

17. The method of claim 13, wherein the first material comprises one of a metal nitride and metal carbide and the second material comprises an oxide.

18. The method of claim 17, wherein the first material is selected from the group consisting of silicon nitride, silicon oxynitride, and silicon carbide.

19. The method of claim 13, wherein the first material includes an oxide and the second material includes one of a metal nitride and metal carbide.

20. The method of claim 13, wherein the patterned photoresist layer comprises a DUV photoresist.

* * * * *